United States Patent [19]

Bullock et al.

[11] 4,152,776

[45] May 1, 1979

[54] MAGNETIC BUBBLE MEMORY CIRCUIT WITH INPUT SWAP AND OUTPUT REPLICATE GATES

[75] Inventors: David C. Bullock; Robert E. Fontana, Jr., both of Dallas; James T. Carlo, Richardson; Shalendra K. Singh, Dallas, all of Tex.

[73] Assignee: Texas Instruments Incorporated, Dallas, Tex.

[21] Appl. No.: 783,996

[22] Filed: Apr. 4, 1977

[51] Int. Cl.$^2$ .............................................. G11C 19/08
[52] U.S. Cl. .......................................... 365/12; 365/7; 365/11; 365/15; 365/33
[58] Field of Search .................... 340/174 TF; 365/15, 365/12

[56] References Cited

U.S. PATENT DOCUMENTS

| 4,007,453 | 2/1977 | Bonyhard et al. | 340/174 TF |
| 4,020,476 | 4/1977 | Bonyhard et al. | 340/174 TF |

OTHER PUBLICATIONS

AIP Conference Proceedings, "64 Fast Access Chip Design", No. 29, pp. 51-53, Dec. 9-12, 1975.

Primary Examiner—James W. Moffitt
Attorney, Agent, or Firm—Melvin Sharp; Richard L. Donaldson; William E. Hiller

[57] ABSTRACT

Magnetic bubble domain memory circuit in which magnetizable overlay patterns of magnetically soft material, e.g. permalloy, are provided as bubble propagation elements on a bubble-supporting magnetic layer to define major and minor bubble propagation paths. The bubble propagation elements are arranged to form major propagation paths defining a bubble input section and a bubble output section respectively. A plurality of minor propagation paths in the form of closed storage loops defining a bubble storage section are disposed between the input and output bubble sections, being arranged in even and odd blocks of minor propagation paths. Input swap transfer gates and output replicate gates are provided between the bubble storage loops and the input and output sections respectively. The input swap transfer gates and the output replicate gates are of double level construction, each type of gate including a hairpin element at the first level and a 90° hook-like element at the second level which is correlated into bubble propagation elements included in a minor storage loop. The 90° hook-like elements of corresponding swap transfer and replicate gates are respectively situated at the input and output ends of the minor storage loops, forming the opposite bights of the loop. Bubble generators and detectors are associated with the input and output bubble sections respectively at the opposite ends of the minor storage loops to provide a magnetic bubble domain memory chip for data processing purposes. Data as represented by the presence or absence of a magnetic bubble is transferred into the minor storage loops and replicated outwardly therefrom into the bubble output section for detection in a manner enabling such data to be received by the bubble detector for readout at the field rate.

20 Claims, 5 Drawing Figures

Fig. 1

MAGNETIC BUBBLE MEMORY CIRCUIT WITH INPUT SWAP AND OUTPUT REPLICATE GATES

This invention relates to magnetic bubble domain memory structures, and more particularly to magnetic bubble domain arrangements providing a double level swap transfer gate and a double level replicate/transfer output gate respectively located at the input and output ends of a corresponding minor propagation path loop included in an intermediate bubble storage section disposed between major bubble propagation paths comprising bubble input and output sections. The particular form of double level swap transfer gate structures and bubble replicate/transfer output gate structures described herein and the environment of the magnetic bubble domain memory circuit in which they are disposed constitute improvements of the subject matter disclosed and claimed in pending U.S. applications, Ser. No. 695,485 filed June 14, 1976 now U.S. Pat. No. 4,070,659 entitled "Magnetic Bubble Domain Memory Chip With Major/Minor Bubble Path Configuration", now U.S. Pat. No. 4,070,659 issued Jan. 24, 1978, and Ser. No. 695,483 filed June 14, 1976 entitled "Bubble Propagation Circuit With Half-Disc Elements".

Typically, magnetic domain memories include one or more memory storage loops, accommodating a plurality of magnetic single-walled domains or bubbles, each of which represents one bit of binary information. These bubbles may be rotated about individual memory storage loops in a synchronized and controlled manner such that access to the stored information imparted thereby can be gained. The memory storage loops are usually organized as a plurality of minor storage loops associated with a major storage loop, wherein information in the form of a series of magnetic bubble domains and voids respectively representing binary "1's" and "0's" may be transferred between the major loop and each of the respective minor loops so as to enable information to be read from the memory and to be written into the memory as desired. The magnetic bubble domain memory chip comprises a substrate of non-magnetic material on which a planar film or layer of magnetic material capable of supporting magnetic bubble domains is disposed. The magnetic bubbles are caused to travel along predetermined paths within the layer of bubble-supporting magnetic material by laying down a magnetizable bubble propagation path pattern on the layer of magnetic material as a series of thin film propagation elements of magnetically soft material, e.g. permalloy, in the form of tiny geometric shapes or circuit elements. In this respect, a magnetic drive field within the plane of the layer of magnetic material is rotated which causes the individual propagation elements included in the bubble propagation path pattern to be sequentially polarized in a cyclical sequence causing the individual bubbles to be propagated in a step-wise movement along the path as defined by the magnetizable propagation elements. One such overlay pattern commonly employed in a magnetic bubble domain memory chip is the so-called series of alternating T-shaped and bar-shaped permalloy elements. A chevron pattern of permalloy elements is another common configuration for this purpose. Magnetic bubble domain memories and the general types of bubble propagation paths employed therewith in the processing of data as represented by the presence and absence of magnetic bubble domains as hereinbefore described are disclosed in the article "Magnetic Bubbles" by Andrew H. Bobeck and H. E. D. Scovil, in Scientific American magazine, pages 78–90 (June 1971).

While these bubble propagation path patterns on a magnetic bubble domain memory chip have generally provided satisfactory operation, the small size of the magnetizable circuit elements as employed in the bubble propagation path pattern overlay as used for magnetic bubbles of five micron size or smaller and the precision with which these soft magnetic elements must be applied to the bubble-supporting magnetic layer present difficulties in maintaining the limited alignment tolerances required to produce a bubble propagation path pattern complete with bubble function-determining components, such as bubble generators, replicators, annihilators and transfer gates, for example, which operates in a fully reliable manner in propagating bubbles in guided paths about the bubble-supporting magnetic layer of the memory chip. In this connection, the movement of each of the bubbles on the memory chip as to direction and the action thereon by various bubble function-determining components must be precise and wholly predictable if the memory chip is to perform in a manner enabling data retrieval as represented by the presence or absence of magnetic bubbles when read from the memory chip output by suitable magnetic bubble detectors. Additionally, it is desirable to so construct the memory chip to enable non-destructive readout of data, thereby requiring a replicate function on the chip to replicate respective bubbles as these bubbles are being directed onto a readout path for subsequent sensing by a bubble detector and erasure by an annihilator. The replicate bubble is returned to the same virtual position in a bubble propagation path from which the bubble to be subsequently detected had departed to preserve the data intact on the memory chip. To this end, magnetic bubble domain memory chips commonly include a bubble replicate function therewith in the form of a particular bubble replicate member disposed in the bubble propagation path pattern at an appropriate location and operable to effectively split a bubble to be subsequently read out, thereby producing two bubbles with the second replicate bubble being returned to the same virtual position departed by the bubble to be readout. Bubble replicator structures heretofore known, in a like manner to the individual propagation elements of magnetically soft material included in the bubble propagation path pattern, have been subject to extremely narrow tolerance ranges in relation to control conductors to which the bubble replicators are responsive in order to properly perform the replicate function in duplicating a bubble to be read out by a bubble detector on the chip.

The magnetic bubble domain memory circuit of the aforesaid pending U.S. Pat. application Ser. No. 695,485 filed June 14, 1976, now U.S. Pat. No. 4,070,659 issued Jan. 24, 1978, includes in addition to a transfer gate structure between the bubble input section and each of the storage loops in the bubble storage section, a composite replicate/transfer gate structure alternatively operable in a first composite replicate-transfer mode wherein a bubble is replicated while being transferred from the bubble storage section to the bubble output section for readout and in a second transfer only mode where a bubble is merely transferred from the bubble storage section to the bubble output section. However, the type of chip architecture employed in the formation of the major and minor bubble propagation paths in each of the two pending U.S. applications Ser. Nos. 695,485 and 695,483, each filed on June 14, 1976, does have restrictive limitations concerning data access time, thereby resulting in an overall rate of data processing at a level less than the field access rate.

A swap transfer gate structure and a replicate/transfer output gate structure of a generally similar character to the swap transfer gate and the replicate/transfer output gate herein contemplated are disclosed in an article entitled "68 kBit Capacity 16 μm-Period Magnetic Bubble Memory Chip Design With 2 μm Minimum Features" by P. I. Bonyhard and J. L. Smith appearing in IEEE Transactions on Magnetics, Vol. MAG-12, No. 6, pp. 614–617 (Nov. 1976). However, the so-called swap transfer gate disclosed in the aforesaid article is not a true swap transfer gate because the virtual positions of data bits being swapped between a major propagation path and a minor storage loop are not maintained. Thus, the structure is more properly termed a pseudo-swap transfer gate. The replicate/transfer output gate of the Bonyhard et al article is subject to a similar limitation in data processing which restricts its usefulness.

SUMMARY OF THE INVENTION

In accordance with the present invention, a magnetic bubble domain structure is provided in which a block replicate bubble propagation path architecture is employed in conjunction with swap transfer gates and replicate gates enabling fast access to data, wherein the magnetic bubble domain memory structure is capable of data readout equal to the field access rate. A block replicate bubble propagation path architecture is generally described in an article entitled "64K Fast Access Chip Design" by J. E. Ypma, I. S. Gergis and J. L. Archer appearing in AIP Conference Proceedings No. 29 Magnetism & Magnetic Materials, pp. 51–53 (1975). The magnetic bubble domain memory circuit as contemplated herein provides a bubble propagation path pattern of magnetically soft material disposed on a layer of bubble-supporting magnetic material which includes major propagation paths respectively defining bubble input and output sections, with an intermediate bubble storage section disposed therebetween. The intermediate bubble storage section includes a pair of blocks, each consisting of a plurality of minor bubble propagation paths arranged as storage loops, there being a first "even" block of storage loops and a second "odd" block of storage loops. Swap transfer gates are interposed between the bubble input section and each of the respective storage loops included in the even and odd blocks comprising the bubble storage section. The swap transfer gates are so configured as to be responsive to a pulsed energy signal from a pulse generator as regulated by an appropriate control circuit for introducing data as represented by chains of magnetic bubbles and voids from the bubble input section to the storage loops included in the even and odd blocks, while simultaneously accomplishing a reverse transfer of data from the respective storage loops of the even and odd blocks comprising the bubble storage section to the bubble input section. Throughout the simultaneous data transfer, the virtual positions of the data bits being swapped are maintained, thereby resulting in a true swap operation as contrasted to the pseudoswap achievable by the structure disclosed in the previously discussed Bonyhard et al article. In addition, replicate gates are disposed between each of the bubble storage loops included in the even and odd blocks comprising the bubble storage section and the bubble output section to enable retention of data within the storage loops while accomplishing data readout in that the replicate gates are effective to split respective magnetic bubbles in response to an appropriate pulsed energy signal imparted thereto by the pulse generator. Thus, the replicate gates upon the splitting of a respective magnetic bubble to form a replicate magnetic bubble in addition to the original magnetic bubble provide for transfer of one of the two bubbles from the storage loop included in the bubble storage section to the bubble output section while retaining the other of the two bubbles in the storage loop. The replicate gates, like the swap transfer gates, maintain intact the virtual positions of the data bits directed thereto.

More specifically, the present invention contemplates the use of a swap transfer gate structure and a replicate gate structure in conjunction with a magnetic bubble domain memory circuit of the general character including a bubble storage section comprising a plurality of minor propagation paths in the form of storage loops and cooperating with input and output bubble sections as defined by major bubble propagation paths. In this connection, the particular swap transfer gate and replicate gate structures herein envisioned are of double level construction, wherein the magnetic bubble domain memory circuit itself comprises a multi-level assembly including a non-magnetic substrate, a planar layer of bubble-supporting magnetic material disposed thereon, and a multi-level assembly including patterned first and second metallization levels separated by an intermediate insulation layer disposed on the planar layer of magnetic material. The first metallization level includes the control conductors for the bubble function-determining components and the propagation elements which constitute the permalloy overlay pattern forming the second metallization level. Thus, each of the swap tranfer gate and the replicate gate structures includes an elongated hairpin element having a hairpin loop defined at one end thereof, this hairpin element forming part of the first metallization level of control conductors and being mounted directly onto the planar layer of bubble-supporting magnetic material. The insulation layer is disposed atop the hairpin element included in each of the swap transfer gate and replicate gate structures.

The second level of the swap transfer gate structure is disposed at the same level as the permalloy elements defining the bubble propagation paths and includes a 90° hook-like transfer element disposed at one end of a corresponding storage loop so as to form a bight of the loop. The 90° hook-like element includes an intermediate leg portion thereof in registration with the hairpin element disposed therebeneath. Bubble steering spacer elements are also disposed in the second level of the swap transfer gate structure, being of irregular crescent shape and providing respective guidance paths associated with the minor propagation path defining the storage loop and with the major propagation path defining the bubble input section. Operation of the pulse generator in a selected control mode to develop a pulsed energy signal of a predetermined width directed to the hairpin element of the swap transfer gate structure enables data as represented by chains of magnetic bubbles and voids to be simultaneously interchanged between the bubble input section and the storage loop included in the bubble storage section. In this way, it is possible to introduce new data into the bubble storage section during a write mode while simultaneously withdrawing old data from the bubble storage section, thereby materially reducing the time required for the substitution of new data into the bubble storage section of the magnetic bubble domain memory chip.

In like manner, the replicate gate structure herein disclosed includes a 90° hool-like element disposed at the second level thereof, the hook-like element being located at the end of the storage loop opposite from the hook-like element of the swap transfer gate structure associated with the same storage loop and forming the other bight of the loop. The hook-like element includes an intermediate leg portion thereof in overlapping relation to the hairpin loop region of the hairpin element. Additionally, a bubble steering element of irregular crescent shape is located in the second level so as to provide a guidance path between a corresponding end of the hook-like element and a bubble propagation element of the storage loop.

Generally, the swap transfer gate and replicate gate structures contemplated by the present invention permit greater flexibility in data processing with a magnetic bubble domain memory circuit in which the structures are included. In this connection, faster loading of the storage loops included in the bubble storage section is possible, inasmuch as the substitution of new data for old may be accomplished simultaneously by virtue of the individual swap transfer gates associated with each of the storage loops included in the bubble storage section. The replicate gate structure enables the data to be retained intact in the bubble storage section during readout of such data by splitting each magnetic bubble to form a replicate magnetic bubble in addition to the original bubble such that one of the two bubbles may be transferred from the bubble storage section to the bubble output section for sensing by the bubble detector in a readout mode, while the other of the two bubbles is retained in its same virtual position in a storage loop of the bubble storage section.

More particularly, the swap transfer gate and replicate gate structures herein contemplated have applicability in a block replicate architecture for a magnetic bubble domain memory circuit. In this connection, the storage loops included within the bubble storage section may be grouped in two blocks, each containing a plurality of such storage loops and identified as the "even" and "odd" blocks, respectively. A pair of bubble generators are provided in association with the even and odd blocks, the generators being operated in series. When data is to be introduced into the bubble storage section via the swap transfer gates, even data bits are introduced into the even block and odd bits to the odd block. The bubble output section includes respective even and odd bubble propagation tracks corresponding to the even and odd blocks in which the data to be read out is stored. The even and odd bubble propagation tracks are combined at a merge junction point, with a single bubble propagation track leading away from the merge junction point to the bubble detector for data readout. This architecture enables data readout to proceed at the same rate as the field rate at which data is introduced to the bubble storage section. Thus, faster data access as compared to typical magnetic bubble domain chip architectures of the major/minor loop type is achievable with this block replicate architecture.

Figure 1:
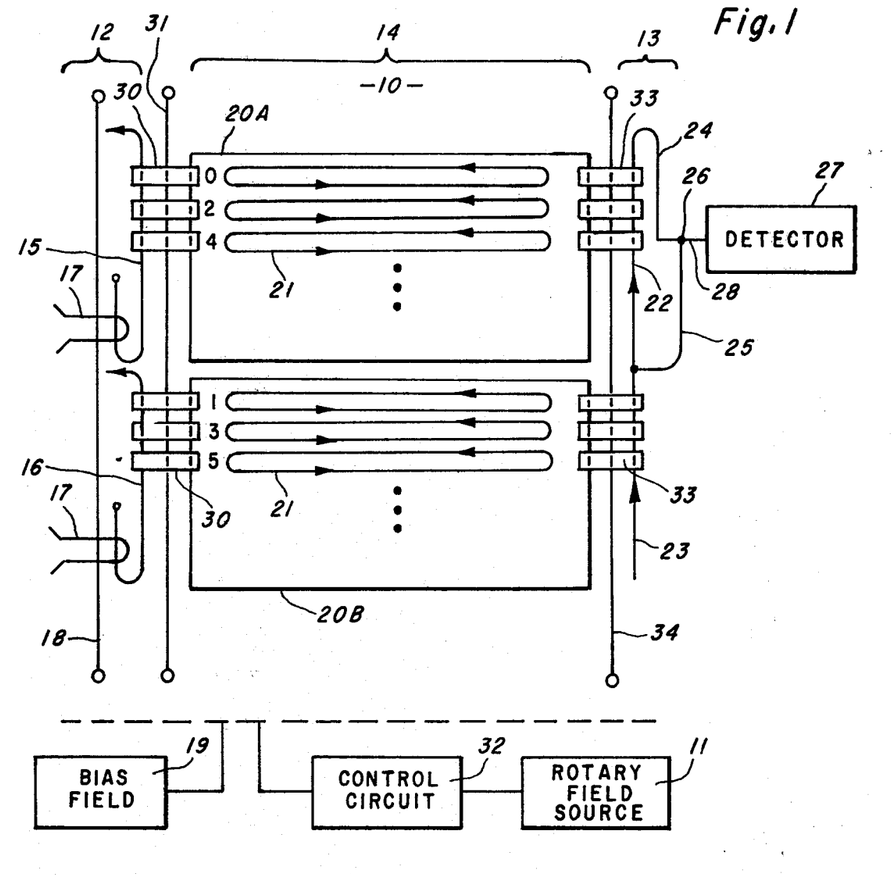
FIG. 1 is a diagramatic view of a magnetic bubble domain memory chip architecture of block replicate type and employing swap transfer and replicate gates in accordance with the present invention.

Referring more specifically to the drawings, FIG. 1 schematically illustrates a magnetic bubble domain memory circuit architecture having specific applicability to the particular swap transfer gate and replicate gate structures as constructed in accordance with the present invention. It will be understood that the magnetic bubble domain memory chip of FIG. 1 comprises a non-magnetic substrate portion having a planar bubble-supporting magnetic film or layer possessing a uniaxial anisotropy, the bubble-supporting planar magnetic layer being generally designated at 10. Typically, the non-magnetic substrate is a non-magnetic rare earth garnet, gadolinium gallium garnet (GGG) for example, and the film or layer 10 is an epitaxially deposited garnet layer, e.g. $(YSmCaLu)_3 (FeGe)_5 O_{12}$ of the order of about 2 microns in thickness for use with magnetic bubbles of 2 microns in diameter and having an easy magnetization in a direction perpendicular to the plane of the layer. Other materials suitable as the epitaxially grown layer of bubble-supporting magnetic material and which may have a thickness range of the order of 1–10 microns include: $(YSm)_3 (FeGa)_5 O_{12}$, $(YGdTm)_3 (FeGa)_5 O_{12}$, $(YEuYb)_3 (FeAl)_5 O_{12}$, $(YGdYb)_3 (FeGa)_5 O_{12}$, $(YEu)_3 Fe_5 O_{12}$, $(LuSm)_3 Fe_5 O_{12}$, $(YGd)_3 Fe_5 O_{12}$ and $(YSmCa)_3 (FeGe)_5 O_{12}$.

In FIG. 1, a bubble propagation path pattern is disposed on the layer of magnetic material 10 for guiding the movement of the bubbles in the layer 10 in response to a change in orientation of a rotary magnetic field within the plane of the layer 10, the rotary in-plane magnetic field being provided from a rotary field source 11. The bubble propagation path pattern may comprise an overlay pattern of magnetically soft material, e.g.

permalloy, disposed on a major surface of the planar magnetic layer 10. In the latter connection, it will be understood that a multi-level assembly is formed on the planar magnetic layer 10 including patterned first and second metallization layers and a layer of insulating material, such as silicon dioxide, interposed therebetween. The first metallization layer is patterned to define control conductors and component parts of bubble function-affecting structures as hereinafter described. The patterned second metallization layer comprises the overlay pattern of magnetically soft material. As shown in FIG. 1, this overlay pattern of magnetically soft material is generally arranged to include a bubble input section 12, a bubble output section 13, and an intermediate bubble storage section 14 disposed between the bubble input section 12 and the bubble output section 13. The bubble input section 12 and the bubble output section 13 comprise major bubble propagation paths, while the intermediate bubble storage section 14 comprises a plurality of minor bubble propagation paths in the form of individual closed bubble storage loops. The bubble input section 12 includes a pair of major propagation paths 15 and 16 arranged in a tandem configuration, with each major propagation path including a bubble generator 17 thereon. Each bubble generator 17 may be of a suitable form, such as a hairpin structure, to produce bubbles at each complete rotation of the in-plane magnetic drive field derived from the field source 11 for respective propagation along the major propagation paths 15 and 16 included in the bubble input section 12. For purposes to be made clear hereinafter, the major propagation path 15 will be termed an "even" generator track, and the major propagation path 16 will be termed an "odd" generator track. The generators 17, 17 are operated in series, with the even generator track 15 being constructed so as to have one extra propagation step as compared to the odd generator track 16. The generators 17, 17 are selectively actuated to produce bubbles by applying a pulsed energy signal of a predetermined width to a control conductor 18 operably associated with the generators 17, 17 and included in the first metallization layer. It will be understood that the individual magnetic bubble domains have a diameter as determined by a magnetic bias field supplied by a source 19 and applied substantially perpendicularly to the chip. Bubble diameters as small as 1–5 microns may be employed in the operation of the magnetic bubble domain memory chip herein disclosed.

In accordance with a preferred aspect of this invention, the bubble storage section 14 is arranged in a block replicate form so as to provide first and second blocks 20A and 20B, each of which is defined by a respective plurality of bubble storage loops 21. The first block 20A of the bubble storage section 14 is an "even" block containing minor storage loops 21 numbered 0, 2, 4 . . ., and the second block 20B comprises an "odd" block containing minor storage loops 21 numbered 1, 3, 5, . .

The bubble output section 13 includes first and second major propagation paths 22 and 23 arranged in end-to-end relationship, wherein the major propagation path 22 comprises an "even" detector track and the major propagation path 23 comprises an "odd" detector track. The bubble output section 13 further includes respective extensions of the major propagation paths 22 and 23, there being a major propagation path extension 24 associated with the even detector track 22 and a major propagation path extension 25 associated with the odd detector track 23. The combined even detector track 22, 24 of the bubble output section 13 is constructed so as to have one less propagation step as compared to the combined odd detector track 23, 25. In this respect, the extension 24 of the major propagation path 22 doubles back on a portion thereof to intersect with the extension 25 of the major propagation path 23, the extension 25 continuing from the major propagation path 23 in an offset leg and then parallel to a portion of the major propagation path 22. The intersection of the extensions 24, 25 of the even and odd detector tracks 22 and 23 comprises a merge junction point 26. The merge junction point 26 is connected to a suitable bubble detector 27 by a continuation of the major propagation path 28 extending from the merge junction point 26 to the detector 27. The continuation portion of the major propagation path or detector feed track 28 delivers data in the form of respective chains of magnetic bubbles and voids representing binary 1's and 0's at the field rate of data introduction into the magnetic bubble domain memory circuit chip for detection. It will be understood that the data bits delivered to the detector 27 via the detector feed track 28 alternate between even and off bits respectively obtained from the even and odd blocks 20A and 20B.

In accordance with the present invention, a plurality of swap transfer gates 30, corresponding in number to the storage loops 21 in the respective blocks 20A and 20B, are operably interconnected with the minor loops 21 and with the even and odd generator tracks 15 and 16 by virtue of a control line 31 leading to a pulse generator. It will be understood that upon properly pulsing the control line 31 via a control circuit 32 including a variable pulse generator, data interchange may be effected from the bubble input section 12 to the bubble storage section 4 and simultaneously from the bubble storage section 14 to the bubble input section 12. Thus, a bubble may be transferred from the bubble input section 12 to a particular storage loop 21 in the bubble storage section 14 via the swap transfer gate 30 corresponding thereto and vice versa, thereby enabling bubbles to travel simultaneously in either direction between the bubble input section 12 and each of the respective storage loops 21 included in the blocks 20A and 20B upon proper activation of the respective swap transfer gates 30 associated with each of the storage loops 21 in the bubble storage section 14. As previously noted, the pair of generators 17, 17 are operated in series such that when data is swapped from the major propagation paths 15 and 16 into the minor loops 21 of the blocks 20A and 20B, even bits are transferred from the even generator track 15 into the minor loops 21 of the even block 20A, and odd bits are transferred from the odd generator track 16 into the minor loops 21 of the odd block 20B. Any remaining bits on the even and odd generator tracks 15, 16 which are unaffected by the swap pulse are propagated to a guard rail associated with the even and odd generator tracks 15, 16 where such data is annihilated.

Similarly, a plurality of replicate/transfer output gates 33 are provided between each of the respective minor loops 21 included in the even and odd blocks 20A and 20B and the bubble output section 13, being arranged at the ends of the storage loops 21 opposite from the swap transfer gates 30. The plurality of replicate gates 33 are operably interconnected by a control line 34 which is connected to the control circuit 32. The variable pulse generator included in the control circuit 32 upon producing a predetermined pulse of a different width as compared to the pulse required to activate the swap transfer gates 30 is effective to activate the respective replicate/transfer output gates 33.

Upon activation by a proper pulse from the pulse generator along the control line 34, the respective replicate gates 33 perform a composite replicate/transfer function in which any bubble incident thereon from the particular storage loop corresponding thereto is replicated to provide a duplicate or replicate bubble for return to the storage loop in the same virtual position from which it was input to the replicate gate 33, while the bubble is transferred to the bubble output section 13 for propagation along the even or odd detector track 22 or 23 depending upon which of the even or odd blocks 20A or 20B contains the particular storage loop 21. The even and odd detector tracks 22 and 23 guide the respective bubbles transferred from the minor storage loops 21 included in the even and odd blocks 20A and 20B to the detector 27 via the merge junction point 26 and the detector feed track 28, wherein data arrives at the detector 27 for readout at the field rate.

Employing the swap transfer gates 30 and the replicate/transfer output gates 33 in conjunction with a magnetic bubble domain circuit architecture of the block replicate type affords a substantial improvement by reducing the average access time required for the first bit and by reducing the time required for reading the entire data content of the even and odd blocks 20A and 20B as contrasted to magnetic bubble domain memory circuits of the typical major/minor loop type. However, it will be understood that the swap transfer gates 30 and the replicate/transfer output gates 33 may be employed in a typical major/minor bubble propagation path architecture, where the minor bubble propagation paths are arranged in a unitary bubble storage section comprising a plurality of minor loops for interaction with major bubble propagation paths disposed on opposite sides thereof and comprising a bubble input section and a bubble output section respectively. It is further contemplated that the swap transfer gate and replicate/transfer output gate structures herein disclosed could also be employed in a chip architecture where the major propagation path or paths as well as the minor propagation paths define respective closed loops.

Figure 2:
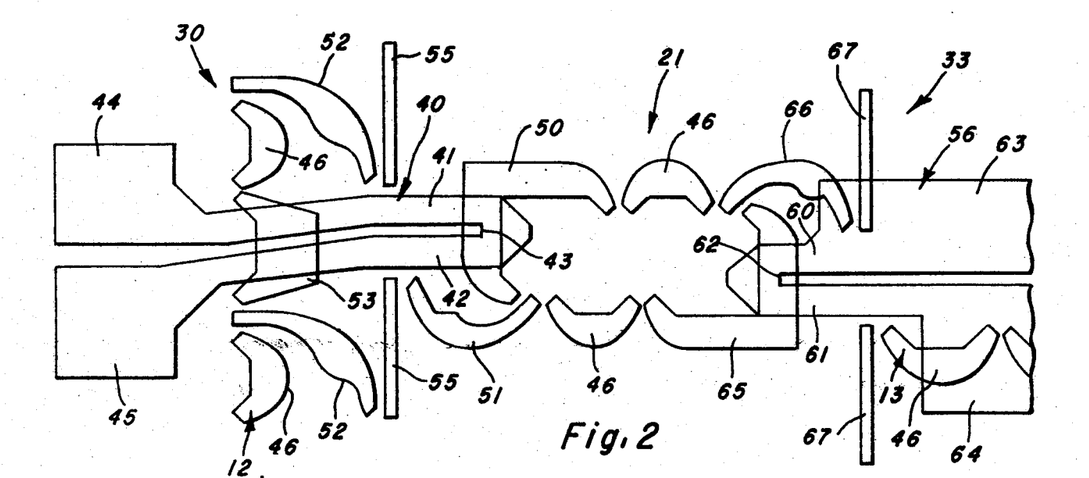
FIG. 2 is an enlarged, partially schematic, plan view of a portion of the magnetic bubble propagation path pattern employable in the magnetic bubble domain memory chip of FIG. 1, and illustrating one embodiment of a swap transfer gate and a replicate gate as located at opposite ends of a data storage loop.

Referring now to FIG. 2, there is illustrated in enlarged schematic form an operable segment of the magnetic bubble domain chip architecture shown in FIG. 1, wherein the swap transfer gate 30 and the replicate/transfer output gate 33 associated with the opposite ends of a storage loop 21 included in the bubble storage section 14 are shown. For purposes of illustration, the individual courses of the closed storage loop 21 have been drastically reduced so as to show only a single individual bubble propagation element of soft magnetizable material (e.g. permalloy) in each of the courses as associated with respective portions of the swap transfer gate 30 and the replicate gate 33. However, it will be understood that a substantial number of bubble propagation elements are provided in defining the respective courses of the closed storage loop 21. The swap transfer gate 30 comprises a double level structure including a first metallization layer in the form of a substantially U-shaped hairpin element 40. The hairpin element 40 includes a pair of elongated substantially parallel legs 41, 42 joined at one end to define a hairpin loop 43. The elongated legs 41, 42 have angularly offset intermediate portions terminating in enlarged pads 44, 45 at the opposite ends thereof with respect to the hairpin loop 43. It will be understood that a patterned insulation layer (not shown) as previously described overlies the substantially U-shaped hairpin element 40 of the swap transfer gate 30, and a second metallization layer is formed thereon to include the other elements of the swap transfer gate 30 at the second level thereof which is at the same level as the individual bubble propagation elements 46 defining the storage loop 21 in the bubble storage section 14. Although the individual bubble propagation elements 46 are illustrated in the form of an arcuate partial disc pickax configuration of the type disclosed and claimed in pending U.S. Pat. application Ser. No. 695,483, filed June 14, 1976, now abandoned, it will be understood that the particular bubble propagation elements 46 are for illustrative purposes only and that any other suitable bubble propagation path elements may be employed, such as the typical path sequence of alternating T and bar elements, for example.

The swap transfer gate 30 includes at the second level thereof a 90° hook-like transfer element 50 which is disposed at one end of the minor bubble propagation path comprising the storage loop 21 so as to form a bight of the loop. The opposite ends of the hook-like transfer element 50 are located in the opposite courses of the loop 21, while an intermediate leg portion of the hook-like element 50 extends across the hairpin element 40 with the insulating layer sandwiched therebetween. The intermediate leg portion of the hook-like element 50 is thereby located in overlapping relation to the hairpin loop region 43 of the hairpin element 40.

The second level of the swap transfer gate 30 further includes first and second spacer elements 51 and 52 in the form of substantially crescent-shaped bubble steering elements. To this end, the first spacer element 51 is associated with the storage loop 21 defined by the minor bubble propagation path, being arranged on one side of the hairpin element 40 so as to include one end portion thereof interposed between a corresponding end of the hook-like element 50 and a propagation element 46 of the storage loop 21. The opposite end of the first spacer element 51 is disposed in proximity to the elongate leg 42 of the hairpin element 40 at a location spaced inwardly from the hairpin loop region 43. The substantially crescent-shaped bubble steering element comprising the first spacer element 51 includes an intermediate hump portion projecting generally toward the hairpin element 40. A pair of second spacer elements 52, 52 are provided in association with the major bubble propagation path which extends in orthogonal relationship to the storage loop 21 and transversely across the angularly offset portions of the legs 41, 42 of the hairpin element 40. In this respect, one of the second spacer elements 52 is associated with the major propagation path on one side of the hairpin element 40, and the other of the second spacer elements 52 is associated with the major propagation path on the opposite side of the hairpin element 40. Each of the respective second spacer elements 52, 52 includes one end portion thereof interposed between individual bubble propagation elements included in the major bubble propagation path. The major bubble propagation path includes a transition bubble propagation element 53 which is located in overlying relation to the angularly offset portions of the elongated legs 41 and 42 of the hairpin element 40. The transition bubble propagation element 53 spans the legs 41 and 42 of the hairpin element 40 and is of generally similar configuration to the half-disc pickax bubble propagation elements 46, but has straight-sided edges which may be generally described as having a symmetrical trapezoidal body provided with tapering legs at the opposite ends thereof. On the upstream side of the major propagation path in relation to the hairpin element 40, the end portion of the second spacer element 52 is interposed between a bubble propagation element 46 and the transition bubble propagation element 53. On the downstream side of the hairpin element 40, a bubble propagation element 46 is disposed between the transition bubble propagation element 53 and the end portion of the respective second spacer element 52. The substantially crescent-shaped bubble steering elements comprising the second spacer elements 52, 52 are provided with intermediate rounded hump portions projecting generally toward the major propagation path.

In the embodiment of the swap transfer gate 30 illustrated in FIG. 2, a pair of pick-off bars 55, 55 are included in the second level, being disposed on opposite sides of the hairpin element 40 so as to be located substantially perpendicular to the parallel elongated legs 41, 42 of the hairpin element 40. The pick-off bar 55 located on the upstream side of the hairpin element 40 with respect to the direction of bubble movement through the major propagation path is disposed between the first spacer element 51 and the second spacer element 52 associated therewith. In this connection, one end of the pick-off bar 55 lies adjacent to one end portion of the first spacer element 51, while the opposite end of the pick-off bar 55 lies adjacent to the end portion of the second spacer element 52 remote from that end portion interposed between individual bubble propagation elements included in the major bubble propagation path. The other pick-off bar 55 is located on the downstream side of the hairpin element 50 and has one end portion disposed adjacent to the end portion of the other second spacer element 52 remote from the major bubble propagation path.

The replicate/transfer output gate 33 is located at the opposite end of the storage loop 21 from the swap transfer gate 30. The replicate gate 33 comprises a double level structure including a first metallization layer in the form of a substantially U-shaped hairpin element 56. The hairpin element 56 includes a pair of substantially parallel legs 60, 61 joined at one end to define a hairpin loop 62. Unlike the configuration of the hairpin element 40 for the swap transfer gate 30, the legs 60, 61 of the hairpin element 56 for the replicate gate 33 are of significantly different lengths in that the leg 60 is relatively short as contrasted to the leg 61. The opposite ends of the legs 60, 61 with respect to the hairpin loop 62 terminate in enlarged pads 63, 64, wherein the pad 63 associated with the short leg 60 is of significantly greater lengthwise extent as compared to the pad 64 associated with the longer leg 61. The patterned insulation layer (not shown) overlies the hairpin element 56 of the replicate gate 33 and the second metallization layer as formed thereon includes the other elements of the replicate gate 33 at the second level thereof which is at the same level as the individual bubble propagation elements 46 defining the storage loop 21 in the bubble storage section 14.

The replicate/transfer output gate 33 includes at the second level thereof a 90° hook-like transfer element 65 which is disposed at the opposite end of the minor bubble propagation path comprising the storage loop 21 from the end at which the hook-like element 50 of the swap transfer gate 30 is disposed. The hook-like element 65 forms the other bight of the storage loop 21. The hook-like transfer element 65 of the replicate/transfer output gate 33 is disposed in diametrically opposite relation as compared to the hook-like transfer element 50 of the swap transfer gate 30, wherein the opposite ends of the hook-like transfer element 65 are located in the opposite courses of the storage loop 21 and an intermediate leg portion of the hook-like element 65 extends across the hairpin element 56 with the insulating layer sandwiched therebetween. The intermediate leg portion of the hook-like element 65 is thereby located in overlapping relation to the hairpin loop region 62 of the hairpin element 56. The second level of the replicate gate 33 further includes a spacer element 66 and a pair of pick-off bars 67, 67. The spacer element 66 is identical to the first spacer element 51 of the swap transfer gate 30, being located in a diametrically opposite relation as compared thereto. The spacer element 66 is therefore in the form of a substantially crescent-shaped bubble steering element and is arranged so as to include one end portion thereof interposed between a corresponding end of the hook-like element 65 and a propagation element 46 of the storage loop 21. The opposite end portion of the spacer element 66 extends into overlapping relationship with the enlarged pad 63 of the underlying hairpin element 56. The pick-off bars 67, 67 are generally disposed on opposite sides of the hairpin element 56 so as to be located substantially perpendicular to the parallel legs 60, 61 of the hairpin element 56. However, the pick-off bar 67 associated with the short leg 60 includes an end portion thereof disposed in overlapping relationship with respect to the enlarged pad 63 of the hairpin element 56. The corresponding end of the other pick-off bar 67 lies adjacent to a bubble propagation element 46 included in the major propagation path forming part of the bubble output section 13.

Figure 3A:
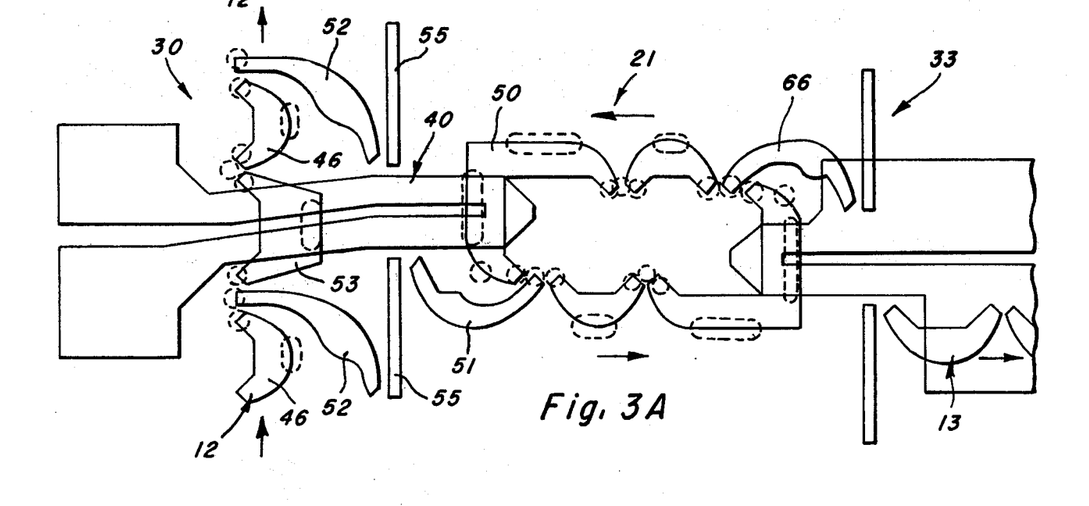
FIG. 3A is an enlarged, partially schematic, plan view similar to FIG. 2, showing the normal propagation movement of respective magnetic bubbles in relation to the swap transfer when the swap transfer gate is not actuated.

Referring to FIG. 3A, the same embodiments of the swap transfer gate 30 and the replicate/transfer output gate 33 as shown in FIG. 2 are depicted therein. FIG. 3A schematically illustrates the propagation of two respective magnetic bubbles, shown in dashed lines, as each bubble travels responsive to the re-orientation of the rotary in-plane magnetic field as derived from the source 11. The first of these bubbles is shown as being located in the major propagation path included in the bubble input section 12, the bubble being propagated in the direction indicated by the arrows. The second bubble is located in the storage loop 21 and is shown in its path of travel completing one circuit of the closed loop included in the bubble storage section 14. It will be noted that the intermediate hump portions included in the several substantially crescent-shaped bubble steering elements 51, 52, 52 and 66 respectively contribute to the location of a magnetic bubble as disposed on the respective hook-like transfer elements of the swap transfer gate 30 and the replicate/transfer output gate 33 and the location of the bubble at an intermediate position of the individual bubble propagation elements 46 disposed in proximity to the respective bubble steering elements 52.

Figure 3B:
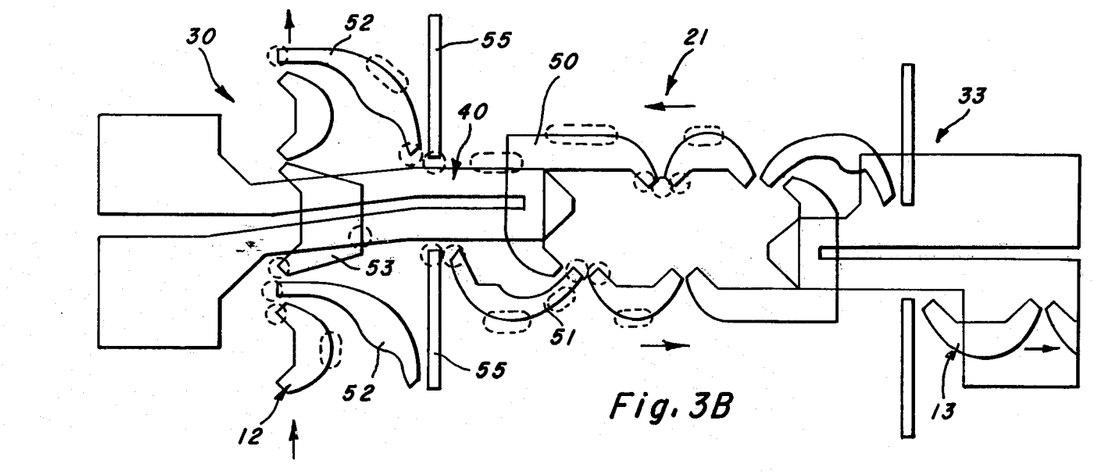
FIG. 3B is an enlarged, partially schematic, plan view similar to FIG. 2, showing the propagation movement of respective magnetic bubbles when the swap transfer gate is actuated in being simultaneously transferred between a major propagation path of the bubble input section and a minor storage loop.

FIG. 3B is similar to FIG. 3A but schematically illustrates the propagation of two respective magnetic bubbles, shown in dashed lines, during a swap operation in which the swap transfer gate 30 is activated by a pulse of energy of a predetermined extent delivered to the hairpin element 40 of the swap transfer gate 30. In this sense, it will be observed that a single magnetic bubble traveling along the major propagation path included in the bubble input section 12 in the direction of the arrows is diverted by the energy pulse so as to be retained on the transition propagation element 53 from where the bubble is picked off by the pick-off bar 55 disposed on the upstream side of the hairpin element 40. Thereafter, this bubble is directed along the bubble steering element 51 onto one course of the storage loop 21. Simultaneously, a bubble traveling along the other course of the storage loop 21 and directed toward the bight of the loop formed by the hook-like transfer element 50 is guided by the hook-like transfer element 50 out of the storage loop 21, being stretched along the outer edge of this hook-like transfer element 50 and thereafter attracted by the other pick-off bar 55. The bubble is then subsequently directed along the bubble steering element 52 comprising the second spacer element on the downstream side of the hairpin element 40 onto the major propagation path included in the bubble input section 12.

Figure 3C:
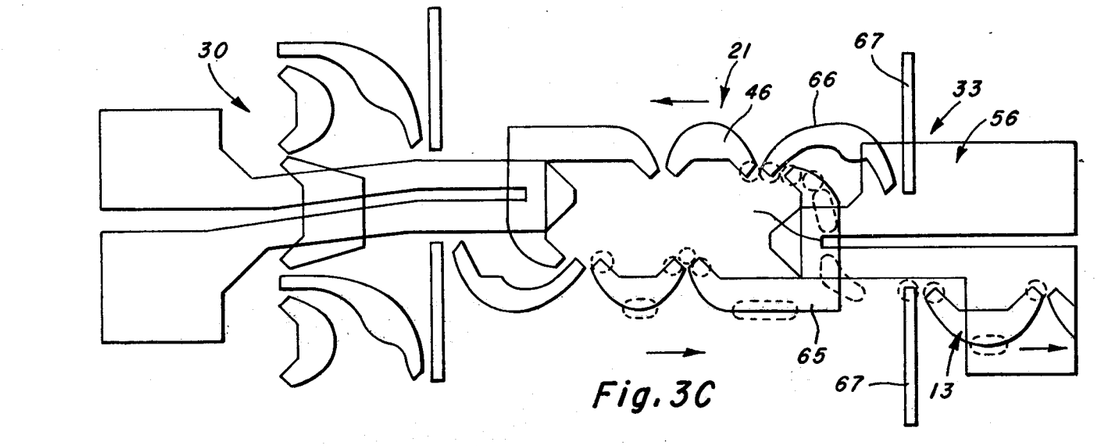
FIG. 3C is an enlarged, partially schematic, plan view similar to FIG. 2, showing the propagation movement of a magnetic bubble when the replicate gate is actuated to provide a replicate function in splitting the bubble to form a second replicate bubble.

FIG. 3C is similar to FIGS. 3A and 3B, but schematically illustrates the propagation of a single magnetic bubble, shown in dashed lines, as it travels through the replicate/transfer output gate 33 when this gate is activated. The bubble approaches the replicate gate 33 along the lower course of the closed storage loop 21, being stretched along the outer edges of the hook-like transfer element 65. The bubble is then stretched across the leg portion of the hook-like element 65 which straddles the underlying hairpin loop region 62 of the hairpin element 56. At this point, the occurrence of a current pulse of the proper magnitude as received by the hairpin element 56 of the replicate gate 33 splits the bubble, thereby forming a duplicate or replicate bubble. The now two bubbles repulse each other such that the lead bubble continues propagation in the closed minor loop 21 by being directed along the remaining leg portion of the hook-like transfer element 65, onto the end portion of the bubble steering element 66 and thence to the adjacent end portion of a bubble propagation element 46. The other bubble is attracted by the end of the pick-off bar 67 from where the bubble continues in its movement onto a bubble propagation element 46 included in the bubble output section 13.

Figure 4:
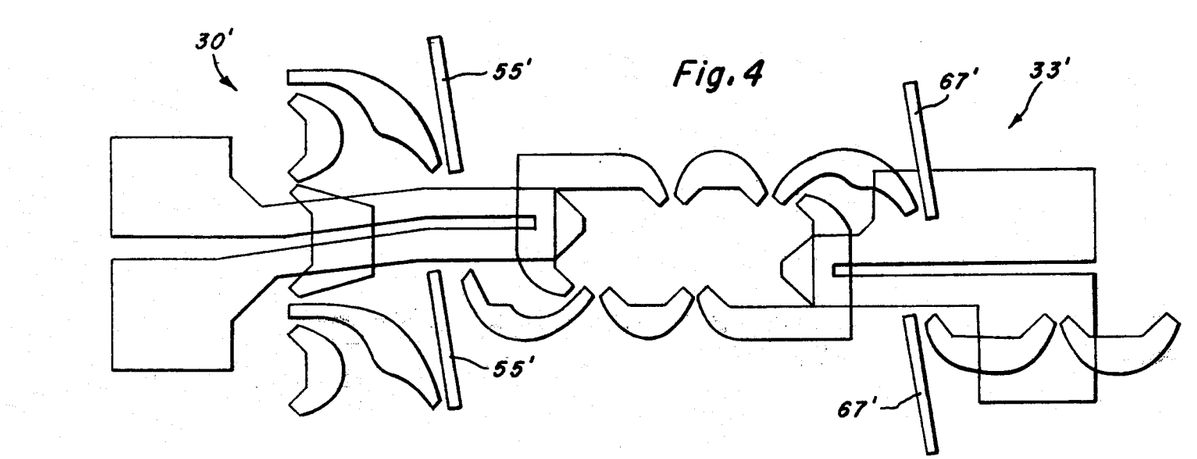
FIG. 4 is an enlarged, partially schematic, plan view similar to FIG. 2, but showing another embodiment of the respective swap transfer gate and replicate gate structures.
Figure 5:
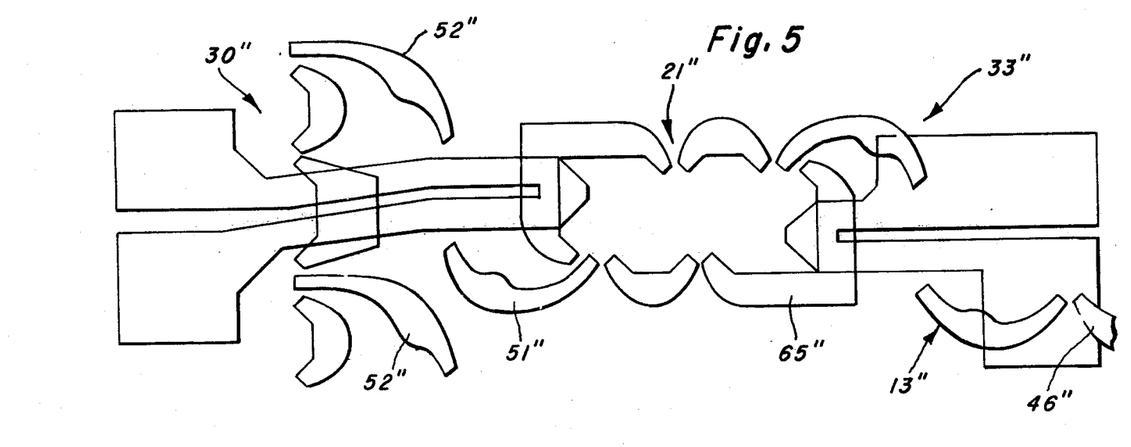
FIG. 5 is an enlarged, partially schematic, plan view similar to FIGS. 2 and 4, but showing yet another embodiment.

Other embodiments of the swap transfer and replicate/transfer output gate structures are respectively illustrated in FIGS. 4 and 5. The embodiment of FIG. 4 includes tilted pick-off bars 55', 55' for the swap transfer gate 30' and tilted pick-off bars 67', 67' for the replicate/transfer output gate 33', but is otherwise identical to the embodiment of FIG. 2. The embodiment of FIG. 5 eliminates the pick-off bars from the swap transfer gate and the replicate/transfer output gate. In this instance, the spatial relationship between the first and second spacer elements 51" and 52", 52" of the swap transfer gate 30" has a more restricted tolerance range in order to provide proper swap operation of incoming and outgoing data with respect to the closed storage loop 21". The same tolerance restriction exists in the replicate/transfer output gate 33". In this embodiment, the leading element of the major bubble propagation path included in the bubble output section 13" takes the form of a crescent-shaped bubble steering element having an intermediate hump portion therein to provide greater reliability in directing replicate bubbles from the leg portion of the hook-like transfer element 65" onto a standard bubble propagation path element 46" included in the major propagation path of the bubble output section 13". It will be understood that bubble propagation in response to re-orientation of the rotary in-plane magnetic field with respect to the swap transfer and replicate/transfer output gate structures of FIGS. 4 and 5 occurs in a manner similar to that depicted in FIGS. 3A-3C in connection with the embodiment of FIG. 2.

The configurations of the swap transfer gate and replicate/transfer output gate described herein afford reasonable tolerances in the gaps existing between successive elements included in given bubble propagation paths. This gap tolerance in turn lessens dimensional constraints on the first and second metallization levels in a field access magnetic bubble domain memory circuit while additionally enabling such swap transfer and replicate/transfer output gate structures to be readily incorporated into a block replicate chip architecture.

Although the invention has been described with respect to specific preferred embodiments thereof, it will be understood that variations and modifications can be made within the scope of the invention by those skilled in the art. Therefore, it is intended that the appended claims be interpreted as broadly as reasonably permitted by the prior art to include all such variations and modifications within the scope of the present invention.

We claim:

1. In a magnetic bubble domain structure of the type including a planar layer of magnetic material in which magnetic bubbles can be moved, an overlay pattern of magnetically soft material disposed on a major surface of said planar magnetic layer and defining a plurality of bubble propagation paths on said major surface of said planar magnetic layer for guiding the movement of said bubbles in said layer in response to a change in orientation of a rotary magnetic field within the plane of said layer,
    said overlay pattern of magnetically soft material including at least one major propagation path and a plurality of minor propagation paths defining a bubble storage section disposed adjacent to said major propagation path,
    swap transfer means interposed between said major propagation path and said bubble storage section, said swap transfer means being operable to interchange data as represented by chains of magnetic bubbles and voids from said major propagation path to said bubble storage section and simultaneously from said bubble storage section to said major propagation path while retaining the interchanged data in the same virtual data bit positions occupied by the respective data bits in the major propagation path and the bubble storage section prior to the interchange,
    pulse generator means operably associated with said swap transfer means and adapted to direct pulse energy thereto, and
    control means regulating said pulse generator means to deliver pulse energy to said swap transfer means, wherein said swap transfer means is operable to simultaneously transfer data as represented by a magnetic bubble or the absence thereof between said major propagation path and said bubble storage section in either direction.

2. A magnetic bubble domain structure as set forth in claim 1, wherein said bubble storage section is divided into a pair of blocks each of which comprises a plurality of minor propagation paths, and further including
    first and second bubble generator means corresponding to the pluralities of minor propagation paths included in the first and second of said blocks respectively, said first and second generator means including respective generator tracks along which even and odd chains of data bits are adapted to be propagated, said swap transfer means being interposed between said first and second generator tracks and said first and second blocks of minor propagation paths, and said swap transfer means being operable in response to actuation thereof by said pulse generator means as regulated by said control means to transfer data into the plurality of minor propagation paths enabling even data bits to enter the first block and odd data bits to enter the second block.

3. In a magnetic bubble domain structure of the type including a planar layer of magnetic material in which magnetic bubbles can be moved, an overlay pattern of magnetically soft material disposed on a major surface of said planar magnetic layer and defining a plurality of bubble propagation paths on said major surface of said planar magnetic layer for guiding the movement of said bubbles in said layer in response to a change in orientation of a rotary magnetic field within the plane of said layer, said overlay pattern of magnetically soft material including major propagation paths disposed in opposite end portions thereof to define a bubble input section and a bubble output section respectively and a plurality of minor propagation paths defining an intermediate bubble storage section disposed between said bubble input section and said bubble output section, swap transfer means interposed between said bubble input section and said bubble storage section, said swap transfer means being operable to interchange data as represented by chains of magnetic bubbles and voids from said bubble input section to said bubble storage section and simultaneously from said bubble storage section to said bubble input section while retaining the interchanged data in the same virtual data bit positions occupied by the respective data bits in the bubble input section and the bubble storage section prior to the interchange, replicate means interposed between said bubble storage section and said bubble output section, said replicate means being operable to split respective magnetic bubbles so as to form a replicate magnetic bubble in addition to the original magnetic bubble for transferring one of the two bubbles from said bubble storage section to said bubble output section while retaining the other of said two bubbles in said bubble storage section in the same virtual data bit position occupied by the original bubble in said bubble storage section prior to replication, detector means disposed in said bubble output section for sensing the presence of magnetic bubbles introduced onto a major propagation path included in said bubble output section, pulse generator means operably associated with said swap transfer means, said replicate means, and said detector means and adapted to direct pulse energy thereto, and control means regulating said pulse generator means to deliver pulse energy selectively to each of said swap transfer means, said replicate means, and said detector means, wherein said swap transfer means is operable to simultaneously transfer data as represented by a magnetic bubble or the absence thereof between said input bubble section and said bubble storage section in either direction said replicate means is operable to split a magnetic bubble on a minor propagation path included in said bubble storage section into two bubbles including an original bubble and a replicate bubble for transfer of one of the two bubbles to a major propagation path included in said bubble output section and retention to the other of said two bubbles in said minor propagation path included in said bubble storage section, and said detector means is operable to sense the movement of a magnetic bubble therepast along a major propagation path included in said bubble output section for readout of data as represented by the presence and absence of magnetic bubbles.

4. A magnetic bubble domain structure as set forth in claim 3, wherein said bubble storage section is divided into a pair of blocks each of which comprises a plurality of minor propagation paths, and further including first and second bubble generator means corresponding to the pluralities of minor propagation paths included in the first and second of said blocks respectively, said first and second generator means including respective generator tracks along which even and odd chains of data bits are adapted to be propagated, said swap transfer means being interposed between said first and second generator tracks and said first and second blocks of minor propagation paths, and said swap transfer means being operable in response to actuation thereof by said pulse generator means as regulated by said control means to transfer data into the plurality of minor propagation paths enabling even data bits to enter the first block and odd data bits to enter the second block.

5. A magnetic bubble domain structure as set forth in claim 4, wherein said detector means includes a pair of detector tracks respectively corresponding to said first and second blocks of minor propagation paths, a merge junction common to and combining said first and second detector tracks, a detector feed track connected to said merge junction, and a bubble detector receiving as an input said detector feed track, whereby data represented by the presence of magnetic bubbles or the absence thereof as transferred to said bubble output section by said replicate means is delivered to said bubble detector at the field rate for readout.

6. A magnetic bubble domain structure as set forth in claim 3, wherein said plurality of minor propagation paths defining said bubble storage section are in the form of closed loops, said swap transfer means comprising a plurality of double level swap transfer gates interposed between said bubble input section and each of said closed loops and including elements of magnetically soft material respectively correlated into said bubble input section and each of said closed loops, each of said swap transfer gates comprising a hairpin element of conductive material provided on the first level and being mounted on said planar layer of magnetic material, said hairpin element being substantially U-shaped and including a pair of elongated substantially parallel legs joined at one end to define a hairpin loop, and a pair of enlarged pads disposed at the opposite ends of the elongated legs, the second level of each of said swap transfer gates being disposed at the same level as said bubble input section and said closed loops and including a hook-like transfer element forming a bight at one end of the closed loop corresponding thereto, the opposite ends of said hook-like transfer element being respectively disposed in the opposite courses of said loop, said hook-like element including an intermediate leg portion thereof disposed in overlapping relation to the hairpin loop region of said hairpin element, first and second spacer elements disposed at said second level and respectively associated with said bubble input section and said closed loop corresponding thereto, a first spacer element associated with the corresponding closed loop being arranged on one side of said hairpin element and including an end portion interposed between a corresponding end of said hook-like element and an element of said closed loop, and a second spacer element being disposed on the other side of said hairpin element in off-set relation to said first spacer element and including one end portion interposed between individual bubble propagation elements included in said bubble input section, and said replicate means comprising a plurality of double level bubble replicate gates interposed between each of the plurality of closed loops and said bubble output section and including elements of magnetically soft material respectively correlated into each of said closed loops and said bubble output section, each of said replicate gates comprising a hairpin element of conductive material provided on the first level and being mounted on said planar layer of magnetic material, said hairpin element being substantially U-shaped and including a pair of substantially parallel legs joined at one end to define a hairpin loop, and a pair of enlarged pads disposed at the opposite ends of the legs, the second level of each of said replicate gates being disposed at the same level as said closed loops and said bubble output section and including a hook-like transfer element forming a bight at the other end of the closed loop corresponding thereto, the opposite ends of said hook-like transfer element being respectively disposed in the opposite courses of said loop, said hook-like element including an intermediate leg portion thereof disposed in overlapping relation to the hairpin loop region of said hairpin element, and a spacer element disposed at said second level and respectively associated with said closed loop corresponding thereto and said bubble output section, said spacer element being arranged on one side of said hairpin element in partially overlapping relationship with the enlarged pad at the end of one of said legs and including an end portion interposed between a corresponding end of said hook-like element and an element of the closed loop corresponding thereto.

7. A magnetic bubble domain structure as set forth in claim 6, wherein said hook-like transfer elements of a corresponding swap transfer gate and a replicate gate forming respective bights at the opposite ends of the same closed loop are positioned in diametrically opposed relationship to each other so as to respectively present one leg portion each forming continuations of the opposite courses of the closed loop.

8. A magnetic bubble domain arrangement comprising:

a planar layer of magnetic material in which magnetic bubbles can be moved, first and second bubble propagation paths provided on a major surface of said planar magnetic layer for guiding the movement of said bubbles in said layer in response to change in orientation of a rotary magnetic field within the plane of said layer, each of said first and second bubble propagation paths comprising a plurality of bubble propagation elements of magnetically soft material, said first bubble propagation path defining a closed loop, said second bubble propagation path being disposed substantially in orthogonal relation to said first bubble propagation path, double level swap transfer gate means interposed between said first and second bubble propagation paths and including elements of magnetically soft material respectively correlated into each of said first and second bubble propagation paths, said swap transfer gate means being operable to interchange data as represented by chains of magnetic bubbles and voids from said second bubble propagation path to said first bubble propagation path and simultaneously from said first bubble propagation path to said second bubble propagation path while retaining the interchanged data in the same virtual data bit positions occupied by the respective data bits in the first and second bubble propagation paths prior to the interchange, said swap transfer gate means comprising a hairpin element of conductive material provided on the first level and being mounted on said planar layer of magnetic material, said hairpin element being substantially U-shaped and including a pair of elongated substantially parallel legs joined at one end to define a hairpin loop, and a pair of enlarged pads disposed at the opposite ends of the elongate legs, the second level of said swap transfer gate means being disposed at the same level as said first and second bubble propagation paths and including a hook-like transfer element disposed at one end of said first bubble propagation path and forming a bight of the loop defined thereby, the opposite ends of said hook-like transfer element being respectively disposed in the opposite courses of the loop defined by said first bubble propagation path, said hook-like element including an intermediate leg portion thereof disposed in overlapping relation to a hairpin loop region of said hairpin element, first and second spacer elements disposed at said second level and respectively associated with said first and second bubble propagation paths, a first spacer element associated with said first bubble propagation path being arranged on one side of said hairpin element and including an end portion interposed between a corresponding end of said hook-like element and an element of said first bubble propagation path, and a second spacer element being disposed on the other side of said hairpin element in off-set relation to said first spacer element and including one end portion interposed between individual bubble propagation elements included in said second bubble propagation path.

9. A magnetic bubble domain arrangement as set forth in claim 8, wherein said hook-like transfer element includes respective leg portions disposed at a 90° angle with respect to each other, one of said leg portions forming a continuation of one course of the loop defined by said first bubble propagation path.

10. A magnetic bubble domain arrangement as set forth in claim 8 wherein said pair of elongated substantially parallel legs includes intermediate angularly offset parallel leg portions remote from said hairpin loop and integral with said pair of enlarged pads.

11. A magnetic bubble domain arrangement as set forth in claim 8, wherein a pair of said second spacer elements are provided, the other of said second spacer elements being disposed on the same side of said hairpin element with respect to said first spacer element and including one end portion interposed between individual bubble propagation elements included in said second bubble propagation path.

12. A magnetic bubble domain arrangement as set forth in claim 8, further including a pair of pick-off bars disposed in the second level of said swap transfer gate, means said pair of pick-off bars being located on opposite sides of said hairpin element in spaced relation to said first and second spacer elements respectively.

13. A magnetic bubble domain arrangement as set forth in claim 12, wherein said pair of pick-off bars are disposed in substantially perpendicular relation to the elongate legs of said hairpin element.

14. A magnetic bubble domain arrangement as set forth in claim 12, wherein said pair of pick-off bars are disposed in parallel relation with respect to each other and angularly offset from perpendicular relation to the elongate legs of said hairpin element in a tilted formation.

15. A magnetic bubble domain arrangement comprising:
a planar layer of magnetic material in which magnetic bubbles can be moved,
first and second bubble propagation paths on a major surface of said planar magnetic layer for guiding the movement of said bubbles in said layer in response to a change in orientation of a rotary magnetic field within the plane of said layer, each of said first and second bubble propagation paths comprising a plurality of bubble propagation elements of magnetically soft material,
said first bubble propagation path defining a closed loop,
said second bubble propagation path being arranged in substantially orthogonal relationship with respect to said first bubble propagation path,
double level bubble replicate gate means interposed between said first and second bubble propagation paths and including elements of magnetically soft material respectively correlated into each of said first and second bubble propagation paths, said replicate gate means being operable to split respective magnetic bubbles so as to form a replicate magnetic bubble in addition to the original magnetic bubble for transferring one of the two bubbles from said first bubble propagation path to said second bubble propagation path while retaining the other of said two bubbles in said first bubble propagation path in the same virtual data bit position occupied by the original bubble in said first bubble propagation path prior to replication, said replicate gate means comprising
a hairpin element of conductive material provided on the first level and being mounted on said planar layer of magnetic material, said hairpin element being substantially U-shaped and including a pair of substantially parallel legs joined at one end to define a hairpin loop, and a pair of enlarged pads disposed at the opposite ends of the legs,
the second level of said bubble replicate gate means being disposed at the same level as said first and second bubble propagation paths and including a hook-like transfer element disposed at one end of said first bubble propagation path and forming a bight of the loop defined thereby, the opposite ends of said hook-like transfer element being respectively disposed in the opposite courses of the loop defined by said first bubble propagation path, said hook-like element including an intermediate leg portion thereof disposed in overlapping relation to the hairpin loop region of said hairpin element, and
a spacer element associated with said first and second bubble propagation paths, said spacer element being arranged on one side of said hairpin element in partially overlapping relationship with the enlarged pad at the end of one of said legs and including an end portion interposed between a corresponding end of said hook-like element and an element of said first bubble propagation path.

16. A magnetic bubble domain arrangement as set forth in claim 15, wherein said hook-like transfer element includes respective leg portions disposed at a 90° angle with respect to each other, one of said leg portions forming a continuation of one course of the loop defined by said first bubble propagation path.

17. A magnetic bubble domain arrangement as set forth in claim 15, wherein said pair of substantially parallel legs are of differing lengths to provide a relatively short leg and a relatively long leg, and said pair of enlarged pads being of correspondingly different lengths, the enlarged pad disposed at the opposite end of the short leg being of relatively long lengthwise extent, and the enlarged pad disposed at the opposite end of the long leg being of relatively short lengthwise extent as compared to the first-mentioned enlarged pad.

18. A magnetic bubble domain arrangement as set forth in claim 15, further including a pair of pick-off bars disposed in the second level of said bubble replicate gate, means said pair of pick-off bars being located on opposite sides of said hairpin element, one of said pick-off bars having an end portion overlying the enlarged pad associated with one leg of said hairpin element and in spaced relation to said spacer element.

19. A magnetic bubble domain arrangement as set forth in claim 18, wherein said pair of pick-off bars are disposed in substantially perpendicular relation to the legs of said hairpin element.

20. A magnetic bubble domain arrangement as set forth in claim 18, wherein said pair of pick-off bars are disposed in parallel relationship with respect to each other and angularly offset from perpendicular relation to the legs of said hairpin element in a tilted formation.

* * * * *